United States Patent [19]

Ishihara et al.

[11] Patent Number: 5,289,048
[45] Date of Patent: Feb. 22, 1994

[54] ANALOG MULTIPLEXER CIRCUIT HAVING AN ACTIVE LOAD CIRCUIT FUNCTIONING COMMONLY FOR A PLURALITY OF BIPOLAR DIFFERENTIAL AMPLIFYING INPUT CIRCUITS

[75] Inventors: Ichiro Ishihara; Naoki Itoh, both of Tokyo, Japan

[73] Assignee: Kabushiki Kaisha Toshiba, Kawasaki, Japan

[21] Appl. No.: 922,518

[22] Filed: Jul. 31, 1992

[30] Foreign Application Priority Data

Aug. 2, 1991 [JP] Japan .................................. 3-194149

[51] Int. Cl.⁵ ........................ H03K 17/56; G06G 7/10
[52] U.S. Cl. .................................... 307/243; 307/491;
307/254; 307/255; 328/104; 328/154
[58] Field of Search ................ 307/243, 491, 254–255;
328/104, 154

[56] References Cited

U.S. PATENT DOCUMENTS 4,191,856 3/1980 Nagano et al. ...................... 307/243

Primary Examiner—Margaret R. Wambach
Attorney, Agent, or Firm—Finnegan, Henderson, Farabow, Garrett & Dunner

[57] ABSTRACT

An analog multiplexer circuit comprising bipolar differential amplifying input circuits, an active load circuit, a selector circuit, an emitter-grounded circuit, and a switch circuit. Differential analog signals are supplied to each of the input circuits. The active load circuit functions commonly for the input circuits. The selector circuit selects one of the input circuits in accordance with a selection signal. The emitter-grounded circuit is used to output the differentially amplified signal generated by the differential amplifying circuit constituted by the selected input circuit and the active load circuit. The switch circuit is inserted between the active load circuit and one of the input circuits and is turned on and off by the selection signal. When the one of the input circuits is not selected, the switch circuit is off, thus electrically disconnecting the one of the input circuit from other input circuit. When the one of the input circuits is selected, the switch circuit is on, thus electrically connecting the one of the input circuit and the active load circuit.

14 Claims, 1 Drawing Sheet

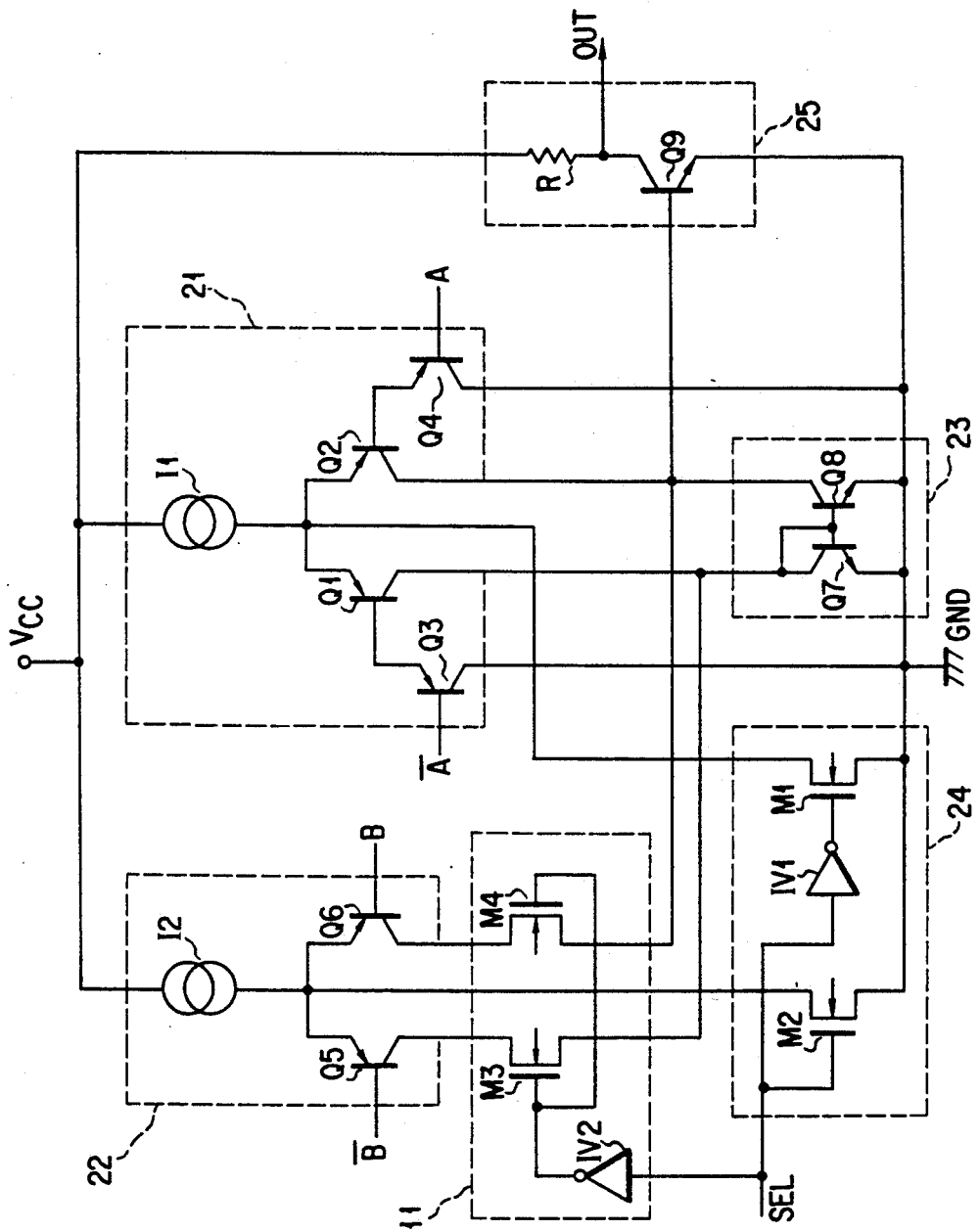
F I G. 1

ANALOG MULTIPLEXER CIRCUIT HAVING AN ACTIVE LOAD CIRCUIT FUNCTIONING COMMONLY FOR A PLURALITY OF BIPOLAR DIFFERENTIAL AMPLIFYING INPUT CIRCUITS

BACKGROUND OF THE INVENTION

1. Field of the Invention

The present invention relates to an analog multiplexer circuit for use in a semiconductor IC device, for differentially amplifying selected ones of a plurality of input differential analog signals and outputting the signals thus amplified. More particularly, the invention relates to an analog multiplexer circuit which has an active load circuit functioning commonly for a plurality of bipolar differential amplifying input circuits.

2. Description of the Related Art

A conventional analog multiplexer circuit comprises, for example, bipolar differential amplifying input circuits, an active load circuit, a selector circuit, and an emitter-grounded circuit.

Each of the bipolar differential amplifying input circuits has a pair of differential input bipolar transistors and a constant current source for supplying an electric current to the emitter node of the bipolar transistors. The bases of the bipolar transistors are connected to receive respective input signals, here termed differential analog signals.

The active load circuit is connected to the collectors of the differential input bipolar transistor of each input circuit, thus functioning commonly for the bipolar differential amplifying input circuits. Hence, the active load circuit simplifies the analog multiplexer circuit and serves to reduce the number of components required in the analog multiplexer circuit.

The selector circuit selects one of the bipolar differential amplifying input circuits, in accordance with a selection signal externally input, and supplies an operating current to the emitter node of the differential input bipolar transistors of the input circuit thus selected. The selected input circuit and the active load circuit constitute a differential amplifier circuit.

The emitter-grounded circuit generates and outputs a differentially amplified signal from the output of the differential amplifier circuit constituted by the selected input circuit and the active load circuit. The analog multiplexer circuit is disadvantageous, however. While one of bipolar differential amplifying input circuits remains in selected state, the differential input bipolar transistors of any other input circuit that is not selected operate in reverse direction. That is, for one of the input bipolar transistors, the collector potential is higher than the emitter potential (i.e., the ground potential) by the base-emitter voltage $V_{BE}$ (usually 0.6 to 0.8V) of the bipolar transistor incorporated in the emitter-grounded circuit. Consequently, a current flows from the collector to the emitter, not from the emitter to the collector as it should in normal condition. In other words, the collector current of one of input bipolar transistors of any input circuit not selected is drained out. An offset voltage is applied to the differential input bipolar transistor of the selected input circuit. This inevitably reduces the accuracy of the output level of the differential amplifier circuit constituted by the selected input circuit and the active load circuit.

To avoid this consequence, it is proposed that a diode be connected between that transistor of the selector circuit which is on, and the emitter node of the differential input bipolar transistors of the input circuit not selected, and be arranged in the forward direction of the current flowing from the collector to emitter of each input bipolar transistor of the input circuit not selected. If a diode is so connected and arranged, it and the transistor of the selector circuit will connect the emitter node to the ground. As a result, the potential of the emitter node of the input circuit not selected is set to a forward drop voltage $V_F$ of the diode. The bipolar transistors of the input circuit not selected can therefore be turned off and are prevented from operating in the reverse direction.

Even if a diode is so connected, the bipolar transistors cannot be turned off in some cases, due to some difference between the base-emitter voltage $V_{BE}$ of each bipolar transistor and the forward drop voltage $V_F$ of the diode. There is the possibility that the bipolar differential amplifying input circuits operate at the same time.

SUMMARY OF THE INVENTION

Accordingly it is an object of this invention to provide a multiplexer circuit in which, while one of bipolar differential amplifying input circuits remains in selected state, the differential input bipolar transistors of any other input circuit, which is not selected, are reliably prevented from operating in a reverse direction.

Another object of the invention is to provide a multiplexer circuit in which, while one of bipolar differential amplifying input circuits remains in selected state, an offset voltage is applied to the differential input bipolar transistors of any other input circuit which is not selected, thereby reliably preventing the output level of the multiplexer circuit from becoming less accurate.

The objects of the invention are achieved by a multiplexer circuit which comprises: a plurality of bipolar differential amplifying input circuits connected to receive differential analog signals; an active load circuit connected to the input circuits, for functioning commonly for the input circuits; a selector circuit for controlling the operating currents of the input circuits in accordance with a selection signal, thereby selecting one of the input circuits; and a switch circuit inserted between the active load circuit and at least one of the input circuits, controlled by the selection signal to be turned on to select at least one of the input circuits and to be turned off not to select at least one of the input circuits.

Since the switch circuit inserted between the active load circuit and at least one of the bipolar differential amplifying input circuits is off while one of the input circuits is selected, the differential input bipolar transistors of any input circuit that is not selected are reliably prevented from operating in a reverse direction. In addition, since the switch circuit is off while one of the input circuits is selected, thus electrically disconnecting the other input circuits, which are not selected, from the selected input circuit, the input circuits not selected are reliably prevented from applying offset voltages to the differential input bipolar transistors of the selected input circuit. Thus, the accuracy of the output level of the multiplexer circuit is not decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 1 is a circuit diagram showing an analog multiplexer circuit according to one embodiment of the present invention.

DETAILED DESCRIPTION OF THE PREFERRED EMBODIMENTS

FIG. 1 shows an analog multiplexer circuit according to the present invention. The circuit comprises a switch circuit 11, bipolar differential amplifying circuits 21 and 22, an active load circuit 23, a selector circuit 24, and an emitter-grounded circuit 25.

Differential analog signals A and $\bar{A}$ are input to the first differential amplifying input circuit 21. Differential analog signals B and $\bar{B}$ are input to the second differential amplifying input circuit 22. The active load circuit 23 is provided to function commonly for both differential amplifying input circuits 21 and 22. The selector circuit 24 controls the operating currents of the input circuits 21 and 22 in accordance with a selection signal SEL, thereby selecting one of these input circuits 21 and 22. The emitter-grounded circuit 25 is provided to output the differential amplified signal generated by the differential amplifying circuit constituted by the selected input circuit (21 or 22) and the active load circuit 23.

The first differential amplifying input circuit 21 comprises PNP bipolar transistors Q1 and Q2, a pair of PNP bipolar transistors Q3 and Q4 for receiving the differential analog signals $\bar{A}$ and A, respectively, and a constant current source I1. The emitters of the transistors Q1 and Q2 are connected to each other, forming an emitter node. The constant current source I1 is connected between the emitter node and a power supply Vcc. The transistor Q3 is Darlington-connected to the transistor Q1, and its base of the transistor Q3 is connected to receive the analog signal $\bar{A}$. The transistor Q4 is Darlington-connected to the transistor Q2, and its base is connected to receive the analog signal A.

The second differential amplifying input circuit 22 comprises PNP bipolar transistors Q5 and A6 and a constant current source I2. The emitters of the transistors Q5 and Q6 are connected to each other, forming an emitter node. The bases of the transistors Q5 and Q6 are connected to receive differential analog signals $\bar{B}$ and B, respectively. The constant current source I2 is connected between the power supply Vcc and the emitter node of the transistors Q5 and Q6.

The active load circuit 23 comprises NPN bipolar transistors Q7 and Q8, which constitute a current mirror circuit. The transistor Q7 has its collector connected to its base and also to the collector of the transistor Q1. The emitter of the transistor Q7 is connected to the ground GND. The transistor Q8 has its collector connected to the collector of the transistor Q2, its base connected to the base of the transistor Q7, and its emitter connected to the ground GND.

The selector circuit 24 comprises N-channel MOS (insulated gate type) transistors M1 and M2 and an inverter circuit IV1. The current path of the transistor M1 is connected at one end to the emitter node of the transistors Q1 and Q2, and at the other end to the ground GND. The gate of the transistor M1 is connected to the output node of the inverter circuit IV1. The input node of the inverter circuit IV1 is connected to receive the selection signal SEL. The current path of the transistor M2 is connected at one end to the emitter node of the transistors Q5 and Q6, and at the other end to the ground GND. The gate of the transistor M2 is connected to receive the selection signal SEL.

The emitter-grounded circuit 25 comprises an NPN bipolar transistor Q9 and a load resistor R. The transistor Q9 has its base connected to the collectors of the transistors Q2 and Q8, and its emitter connected to the ground GND. The load resistor R is connected between the power supply Vcc and the collector of the transistor Q9. An output signal OUT is supplied from the node of the resistor R and the collector of the transistor Q9.

The switch circuit 11 comprises N-channel MOS transistors M3 and M4 and an inverter circuit IV2. Both transistors M3 and M4 function as switching elements. The current path of the transistor M3 is connected at one end to the collector of the transistor Q5, and at the other end to the collector node of the transistors Q1 and Q7. The gate of the transistor M3 is connected to the output node of the inverter circuit IV2. The current path of the transistor M4 is connected at one end to the collector of the transistor Q6, and at the other end to the collector node of the transistors Q2 and Q8. The gate of the transistor M4 is connected to the output node of the inverter circuit IV2. The input node of the inverter circuit IV2 is connected to receive the selection signal SEL.

In the multiplexer circuit described above, the analog signals A and B are not inverted with respect to the output signal OUT, whereas the analog signals $\bar{A}$ and $\bar{B}$ are inverted with respect to the output signal OUT. When the selection signal SEL is at high level (i.e., "H" level), the transistors M1 and M2 are off and on, respectively. The emitter node of the transistors Q5 and Q6, both incorporated in the second differential amplifying input circuit 22, is thereby connected to the ground by the current path of the transistor M2. As a result, the input circuit 22 is made inoperative (or not selected). Meanwhile, the constant current source I1 supplies an operating current to the first differential amplifying input circuit 21, more precisely to the emitter of the transistors Q1 and Q2. The input circuit 21 is thereby made operative (or selected). The input circuit 21 and the active load circuit 23 constitute a differential amplifying circuit, which differentially amplifies the differential analog signals $\bar{A}$ and A. As a result, a differentially amplified signal OUT is output from the emitter-grounded circuit 25.

At this time, the selection signal SEL is at the "H" level, and the transistors M3 and M4 are off. If the analog signal $\bar{B}$ or B is at OV, the emitter and base of the transistor Q5 or Q6 are set at the ground potential, whereas the collector thereof is open. Hence, the transistor Q5 or Q6 is prevented from operating in a reverse direction. Since the second differential amplifying input circuit 22 is electrically disconnected from the first differential amplifying input circuit 21, it applies no offset current to the transistors Q1 to Q4 incorporated in the input circuit 21. The output level of the differential amplifying circuit constituted by the input circuit 21 and the active load circuit 23 will not become less accurate at all.

When the selection signal SEL is at low level (i.e., "L" level), the transistors M1 and M2 are on and off, respectively. The emitter node of the transistors Q1 and Q2, both incorporated in the first differential amplifying input circuit 21, is thereby connected to the ground by the current path of the transistor M1. The input circuit 21 is thereby made inoperative (or not selected). Meanwhile, the constant current source I2 supplies an operating current to the second differential amplifying input circuit 22, and more precisely to the emitter of the transistors Q5 and Q6. The input circuit 22 is thereby made operative (or selected). At this time, the transistors M3 and M4 of the switch circuit 11 are on, and impose no adverse influence on the operation of the second differential amplifying input circuit 22. The input circuit 22 and the active load circuit 23 thereby constitute a differential amplifying circuit, which differentially amplifies the differential analog signals $\bar{B}$ and B. As a result, a differentially amplified signal OUT is output from the emitter-grounded circuit 25.

In the multiplexer circuit having the structure specified above, while the first bipolar differential amplifying input circuit 21 remains selected, the switch circuit 11 inserted between the active load circuit 23 and the differential input bipolar transistors Q5 and Q6 of the second input circuit 22 not selected is off. Hence, the transistors Q5 and Q6, all incorporated in the input circuit 22 are prevented, without fail, from operating in a reverse direction. Since the switch circuit 11 is off, electrically disconnecting the input circuit 22 from the selected input circuit 21, wherein the input circuit 22 is reliably prevented from applying offset voltage to the transistors Q1 to Q4 of the input circuit 21. Thus, the accuracy of the output level of the multiplexer circuit is not decreased.

The embodiment described above has two bipolar differential amplifying input circuits which are selected, one at a time. Nonetheless, the present invention can be applied to a multiplexer circuit having three or more bipolar differential amplifying input circuits, which operates in the same way as the embodiment of FIG. 1 only if a switch circuit which is controlled by a selection signal, is inserted between at least one of the input circuits and the active load circuit functioning commonly for the input circuits.

What is claimed is:

1. A multiplexer circuit comprising:
   bipolar differential amplifying input circuits connected to receive analog signals;
   an active load circuit connected to said bipolar differential amplifying input circuits;
   a selector circuit for controlling operating currents of said bipolar differential amplifying input circuits, in accordance with a selection signal, to select one of said bipolar differential amplifying input circuits; and
   switch means inserted between said active load circuit and at least one of said bipolar differential amplifying input circuits, controlled by the selection signal to be turned on to select said at least one of said bipolar differential amplifying input circuits and to be turned off not to select said at least one of said bipolar differential amplifying input circuits.

2. The multiplexer circuit according to claim 1, wherein at least one of said bipolar differential amplifying input circuits comprises a pair of differential input bipolar transistors, each having a base connected to receive a differential analog signal and an emitter connected to the emitter of the other, forming an emitter node, and a constant current source connected between the emitter node and a power supply.

3. The multiplexer circuit according to claim 1, wherein at least one of said bipolar differential amplifying input circuits comprises first and second bipolar transistors, each having a collector connected to said active load circuit and having an emitter connected to the emitter of the other, forming an emitter node, a constant current source connected between the emitter node and a power supply, and third and fourth bipolar transistors Darlington-connected to said first and second bipolar transistors, respectively, each having a collector connected to ground and a base connected to receive a respective analog signal.

4. The multiplexer circuit according to claim 1, wherein said active load circuit is a current mirror circuit.

5. The multiplexer circuit according to claim 2, wherein said active load circuit includes a pair of load bipolar transistors, each having a collector connected to said switch means, a base connected to the base of the other, and an emitter connected to ground, the collector and base of one of said load bipolar transistors being connected to each other.

6. The multiplexer circuit according to claim 3, wherein said active load circuit includes a pair of load bipolar transistors having collectors connected to said first and second bipolar transistors, respectively, bases connected to each other, and emitters connected to the ground, the collector and base of one of said load bipolar transistors being connected to each other.

7. The multiplexer circuit according to claim 1, wherein said selector circuit includes a plurality of switch elements for controlling the operating current of said bipolar differential amplifying input circuits in response to the selection signal.

8. The multiplexer circuit according to claim 7, wherein each of said switch elements is a MOS transistor.

9. The multiplexer circuit according to claim 2, wherein said selector circuit includes a MOS transistor having a current path connected between ground and the emitter node of said differential input bipolar transistors, a gate connected to receive the selection signal, said MOS transistor being off while receiving the selection signal and being turned on while not receiving the selection signal.

10. The multiplexer circuit according to claim 3, wherein said selector circuit includes a MOS transistor having a current path connected between the ground and the emitter node of said first and second bipolar transistors, a gate connected to receive the selection signal, said MOS transistor being off while selected and being turned on while not selected.

11. The multiplexer circuit according to claim 1, wherein said switch means includes a first and second transistors connected between said active load circuit and at least one of said bipolar differential amplifying input circuits and controlled by the selection signal to be on or off, said first and second transistors being off while said at least one of said bipolar differential amplifying input circuits is selected, and on while said at least one of said bipolar differential amplifying input circuits is not selected.

12. The multiplexer circuit according to claim 5, wherein said switch means includes a pair of switching transistors connected between one of said differential input bipolar transistors and one of said load bipolar transistors, and between the other of said differential input bipolar transistors and the other of said load bipolar transistors, respectively, and controlled by the selection signal to be on or off, said pair of switching transistors being off while said at least one of said bipolar differential amplifying input circuits is not selected, and on while said at least on of said bipolar differential amplifying input circuits is selected.

13. The multiplexer circuit according to claim 1, further comprising an emitter-grounded circuit for outputting a differentially amplified signal generated by a differential amplifying circuit constituted by said active load circuit and the selected one of said bipolar differential amplifying input circuits.

14. The multiplexer circuit according to claim 13, wherein said emitter-grounded circuit comprises a bipolar transistor having a collector, a base connected to said bipolar differential amplifying input circuits, and an emitter connected to the ground, and a load resistor connected between a power supply and the collector of said bipolar transistor, and said output signal is output from the collector of said bipolar transistor.

* * * * *

UNITED STATES PATENT AND TRADEMARK OFFICE
CERTIFICATE OF CORRECTION

PATENT NO. : 5,289,048
DATED : February 22, 1994
INVENTOR(S) : Ichiro Ishihara et al.

It is certified that error appears in the above-indentified patent and that said Letters Patent is hereby corrected as shown below:

Claim 12, column 7, line 3, change "on" (second occurrence) to --one--.

Signed and Sealed this

Sixth Day of September, 1994

Attest:

BRUCE LEHMAN

*Attesting Officer*  *Commissioner of Patents and Trademarks*